(12) United States Patent
Pellizzer (10) Patent No.: US 12,026,601 B2
(45) Date of Patent: Jul. 2, 2024

(54) STACKED ARTIFICIAL NEURAL NETWORKS

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1057 days.

(21) Appl. No.: 16/453,528

(22) Filed: Jun. 26, 2019

(65) Prior Publication Data

US 2020/0410319 A1 Dec. 31, 2020

(51) Int. Cl.
*G06N 3/04* (2023.01)
*G06F 17/17* (2006.01)
*G11C 13/00* (2006.01)

(52) U.S. Cl.
CPC .............. *G06N 3/04* (2013.01); *G06F 17/17* (2013.01); *G11C 13/0021* (2013.01); *G11C 13/0004* (2013.01)

(58) Field of Classification Search
None
See application file for complete search history.

(56) References Cited

U.S. PATENT DOCUMENTS

| 9,015,093 | B1* | 4/2015 | Commons .......... G01C 21/3602 706/26 |
| 9,430,735 | B1 | 8/2016 | Vali |
| 9,619,748 | B1 | 4/2017 | Commons et al. |
| 9,779,355 | B1 | 10/2017 | Leobandung |
| 10,360,971 | B1* | 7/2019 | Hokenmaier ............ G06N 3/08 |
| 10,817,776 | B2* | 10/2020 | Tomita .................... G06N 3/063 |
| 11,308,383 | B2* | 4/2022 | Bayat ....................... G11C 11/54 |
| 11,373,612 | B2* | 6/2022 | Kurokawa ............. G11C 27/04 |
| 11,531,898 | B2* | 12/2022 | Le Gallo-Bourdeau ..................... G06N 3/084 |
| 2011/0307433 | A1 | 12/2011 | Dlugosch |
| 2011/0307503 | A1 | 12/2011 | Dlugosch |
| 2015/0106314 | A1 | 4/2015 | Birdwell et al. |

(Continued)

FOREIGN PATENT DOCUMENTS

JP 2017-130195 A 7/2017
JP 2018201003 A * 12/2018

OTHER PUBLICATIONS

Imani et al. "RAPIDNN: In-Memory Deep Neural Network Acceleration Framework" Apr. 11, 2019, pp. 1-13 https://arxiv.org/pdf/1806.05794.pdf (Year: 2019).*

(Continued)

*Primary Examiner* — Saleh Najjar
*Assistant Examiner* — Shadi H Kobrosli
(74) *Attorney, Agent, or Firm* — Brooks, Cameron & Huebsch, PLLC (57) ABSTRACT

An apparatus, such as a stacked artificial neural network, can include a semiconductor at a first level. The semiconductor can include first circuitry. A memory can be at a second level. Second circuitry can be at a third level such that the memory is between the first circuitry and the second circuitry. The first circuitry can be configured propagate a first signal to the memory. The memory can be configured to propagate a second signal, based on data stored in the memory, to the second circuitry in response to the first signal. The second circuitry can be configured to generate a data signal based on the second signal.

25 Claims, 6 Drawing Sheets

(56) References Cited

U.S. PATENT DOCUMENTS

| | | | |
|---|---|---|---|
| 2017/0228634 A1* | 8/2017 | Tomita | G06N 3/045 |
| 2018/0005588 A1* | 1/2018 | Kurokawa | G09G 3/342 |
| 2018/0174021 A9* | 6/2018 | Lal | H01J 49/025 |
| 2018/0253643 A1 | 9/2018 | Buchanan et al. | |
| 2018/0279476 A1* | 9/2018 | Uemura | H05K 1/181 |
| 2019/0050040 A1 | 2/2019 | Baskaran et al. | |
| 2019/0082077 A1 | 3/2019 | Hu et al. | |
| 2019/0251436 A1* | 8/2019 | Son | G06N 3/063 |
| 2020/0012924 A1* | 1/2020 | Ma | G11C 11/54 |
| 2020/0176069 A1 | 6/2020 | Ikeda et al. | |
| 2020/0242461 A1* | 7/2020 | Tran | G06N 3/045 |
| 2020/0294182 A1* | 9/2020 | George | G06N 3/063 |
| 2023/0048377 A1* | 2/2023 | Crill | G06N 3/045 |
| 2023/0104689 A1* | 4/2023 | Tran | G06F 12/0811 |
| | | | 706/33 |

OTHER PUBLICATIONS

Santoro G, Turvani G, Graziano M. New Logic-In-Memory Paradigms: An Architectural and Technological Perspective. Micromachines. 2019; 10(6):368. https://doi.org/10.3390/mi10060368 (Year: 2019).*

Azarkhish, et al., "Neurostream: Scalable and Energy Efficient Deep Learning with Smart Memory Cubes", Sep. 24, 2017, 15 pages.

International Search Report and Written Opinion from related International Patent Application No. PCT/US2020/035826, dated Sep. 11, 2020, 9 pages.

Kodai Ueyoshi, et al., "QUEST: Multi-Purpose Log-Quantized DNN Inference Engine Stacked on 96-MB 3-D SRAM Using Inductive Coupling Technology in 40-nm", IEEE Journal of Solid-State Circuits, vol. 54, Issue 1, Oct. 15, 2018, 1 page.

* cited by examiner

STACKED ARTIFICIAL NEURAL NETWORKS

TECHNICAL FIELD

The present disclosure relates generally to neural networks, and more particularly, to stacked (e.g., three-dimensional) artificial neural networks.

BACKGROUND

Artificial neural networks are networks that can process signals (e.g., information) by modeling a network of neurons, such as neurons in a human brain. In various instances, an artificial neural network can include an input layer having a number of nodes, an output layer having a number of nodes, and a number of hidden layers, each having a number of nodes, between the input layer and the output layer. For example, each of the nodes can be an artificial neuron, such as a neuron model. The layers can be interconnected by links that can be referred to as synapses. For example, the synapses can interconnect the neuron models.

Signals can be propagated through the artificial neural network from the input layer to the output layer over the synapses that, in some instances, can apply weights to the signals. The signals can be modified by each hidden layer and by the output layer so that the signals output by the output layer are modified relative to signals received at the input layer.

DETAILED DESCRIPTION

In various previous implementations of artificial neural networks, a memory array has been used in conjunction with circuitry integrated in a base semiconductor, such as a monocrystalline semiconductor (e.g., monocrystalline silicon), to facilitate neural network operating characteristics. For example, the memory array can be used to store synaptic weights and the circuitry can be used to generate signals that can be propagated to another layer of the neural network.

In various examples, the semiconductor and the memory array might be a single chip, such as a dynamic random access memory (DRAM) chip. In some instances, to meet the demand for larger artificial neural networks with increased processing capability, a multitude of chips, each with an individual monocrystalline semiconductor and a memory array, have been combined to form an artificial neural network. In some previous approaches, the size of the memory array and the area (e.g., footprint) of the semiconductor have been increased to meet the demand for larger artificial neural networks with increased processing capability. However, increasing the number of monocrystalline semiconductors or the footprint of the monocrystalline semiconductors can be expensive.

The embodiments disclosed herein improve upon previous approaches, involving a multitude of chips and/or increased semiconductor footprints to facilitate neural network operations, by using stacked neural networks, such as single-chip neural networks. For example, the stacked neural networks can meet the demand for larger artificial neural networks with increased processing capability without increasing the number of monocrystalline semiconductors and/or the footprint of the semiconductors.

In various examples, an apparatus, such as a stacked artificial neural network, can include a semiconductor at a first level. The semiconductor can include first circuitry. A memory can be at a second level. Second circuitry can be at a third level such that the memory is between the first circuitry and the second circuitry. The first circuitry can be configured propagate a first signal to the memory. The memory can be configured to propagate a second signal, based on data stored in the memory, to the second circuitry in response to the first signal. The second circuitry can be configured to generate a data signal based on the second signal.

In some examples, a stack of memory layers and layers of circuitry can extend from the semiconductor such that each respective layer of circuitry is between a respective pair of the memory layers. Each respective layer of circuitry can be configured to receive signals from a first memory layer of the respective pair of the memory layers, generate activation signals based on the received signals, and apply the activation signals to a second memory layer of the respective pair of the memory layers.

Placing layers of circuitry within the stack such that each respective layer of circuitry is between a respective pair of the memory layers can simplify routing circuitry, reduce the footprint of the semiconductor, and/or increase the processing speed of the neural network compared to the routing circuitry, semiconductor footprint, and processing speed of neural networks that might perform the functionality of the layers of circuitry in the semiconductor, as might be done in various previous approaches.

Figure 1:
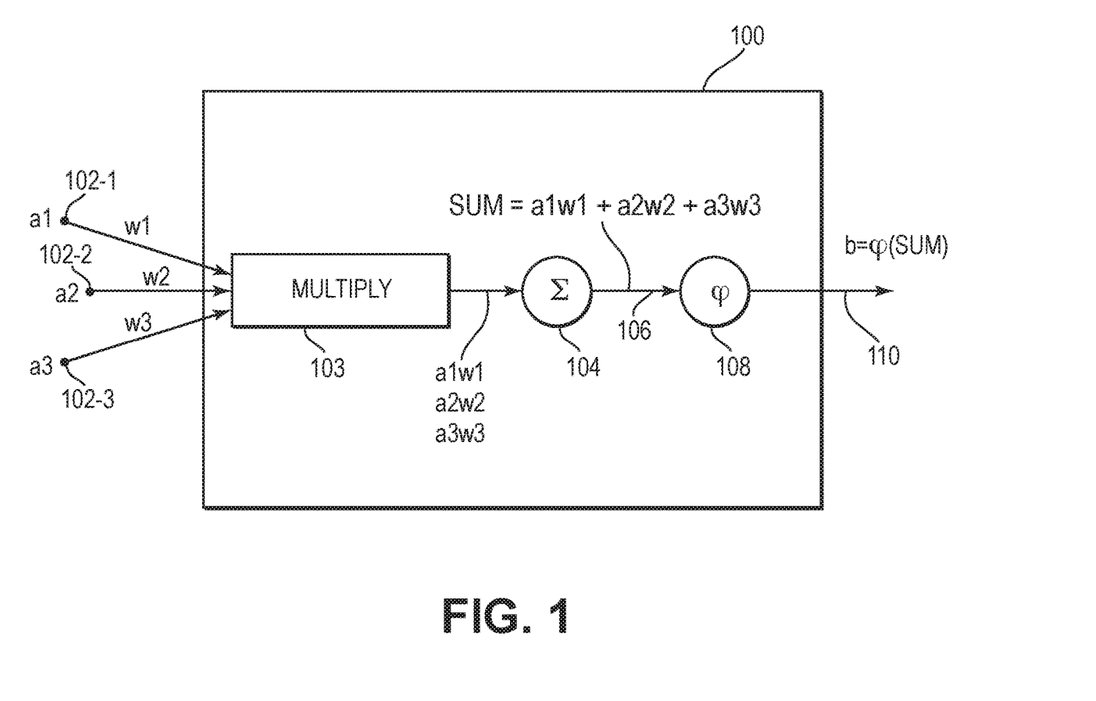
FIG. 1 illustrates an example of an artificial neuron in accordance with a number of embodiments of the present disclosure.

FIG. 1 illustrates an example of an artificial neuron (e.g., neuron model) 100 that can be used to model a neuron (e.g., of a human brain) in accordance with a number of embodiments of the present disclosure. Such neuron models can sometimes be referred to as perceptrons. A number of inputs a1 to a3, which can be referred to as stimuli (e.g., activations), can be respectively applied to inputs 102-1 to 102-3 of neuron model 100. Signals, such as voltages, currents, or particular data values (e.g., binary digits), corresponding to inputs a1 to a3 can be generated responsive to sensing some form of stimuli and can be applied to inputs 102-1 to 102-3.

In various instances, the inputs a1 to a3 can be respectively weighted by the weights w1 to w3 that can be referred to as synaptic weights. Neuron model 100 can include a multiplication function 103 that can respectively multiply inputs a1 to a3 by the weights w1 to w3 to respectively weight inputs a1 to a3. For example, multiplication function 103 can generate the weighted inputs a1*w*1, a2*w*2, and a3*w*3. In some instances, each weighted input can be referred to as a synapse, and the weight can correspond to a memory in human brain behavior. Note that although three inputs and three weights are shown in the example of FIG. 1, the disclosure is not so limited, and there can be various numbers of inputs and weights.

Neuron model 100 can include a summation function 104 that can perform an addition operation on the weighted inputs to produce an output 106, such as SUM=a1*w*1+ a2*w*2+a3*w*3. For example, the weighted signals corresponding to weighted inputs a1*w*1 to a3*w*3 can be summed (e.g., accumulated). In some examples, the summation function can be referred to as a transfer function.

Neuron model 100 further includes a function 108, such as a function φ, configured to respond to the summation SUM and to generate an output data value (e.g., a data signal) b=φ(SUM) at an output 110. For example, function φ can be applied to SUM to generate φ as a function of SUM. In some examples, function 108 can be referred to as an activation function. Outputs of neuron models can sometimes be referred to as classes.

Various functions can be utilized for the function 108. For example, function 108 can include a threshold function (e.g., a step function) to determine if SUM is above or below a particular threshold level. Such a threshold function might generate a logic high output (e.g., a logical 1) on the output 110 if SUM is greater than or equal to the particular threshold amount and might generate a logic low (e.g., a logical 0) on the output 110 if SUM is below the particular threshold amount.

In some examples, function 108 can be a sigmoid function, wherein the sigmoid function might be expressed as $SIG(S)=1/(1+e^{\lambda \cdot S})$, in which λ is a constant and S can be SUM. For example, function 108 can be a non-linear function. In various instances, the generated output value b at the output 110 can be applied to a number of additional neuron models, such as to inputs 102 of different neuron models, or a neural network of neuron models. For example, the output b can be an activation that can activate those neuron models.

Figure 2:
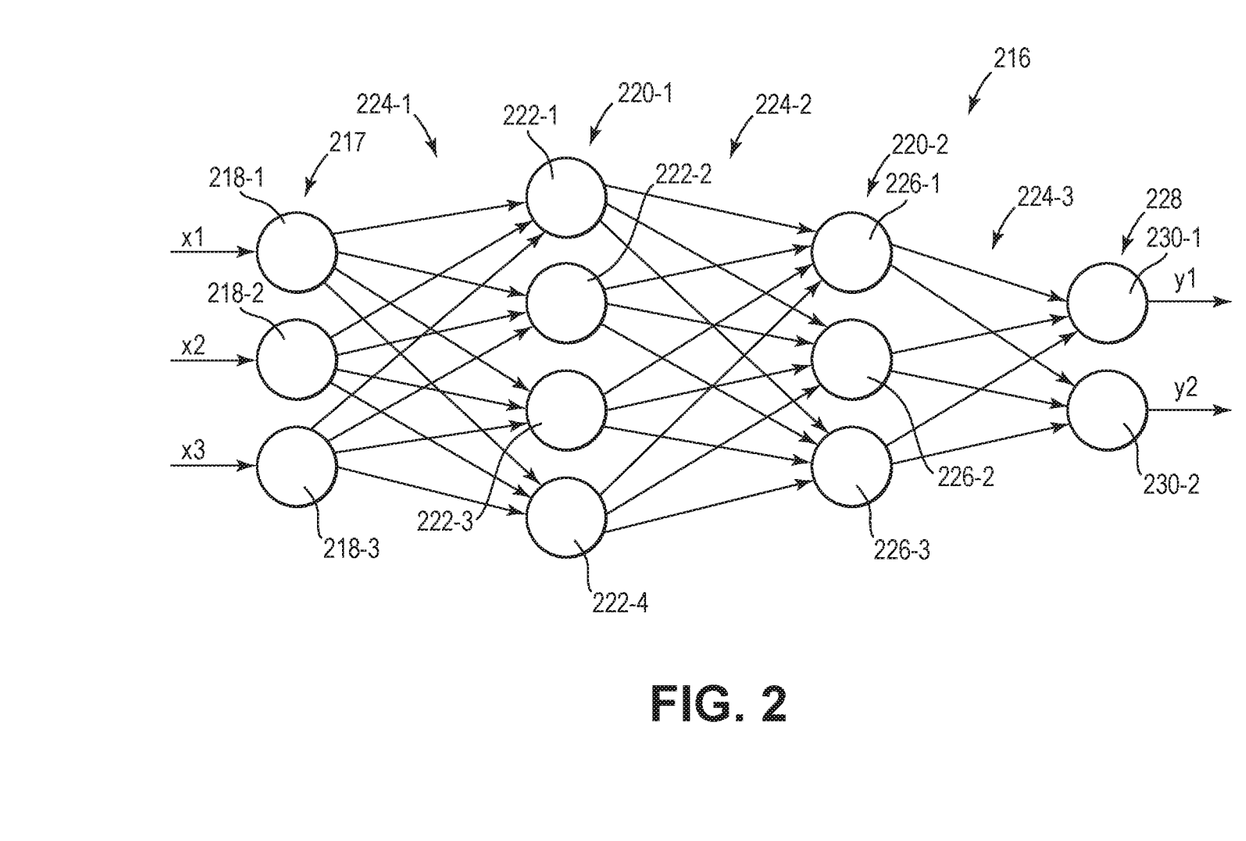
FIG. 2 illustrates an example of an artificial neural network in accordance with a number of embodiments of the present invention.

FIG. 2 illustrates an example of an artificial neural network 216 that can be referred to as a neural network model and that can correspond to the various neural network models disclosed herein in accordance with a number of embodiments of the present invention. The process described in conjunction with FIG. 2 can be referred to as a forward propagation process that can be process of feeding input data values (e.g., data signals) to the neural network and getting an output, such as an output data signal.

In some examples, the forward propagation process can be referred to as inference, and the neural network that performs such a process can be referred to as a convolutional neural network. As used herein the term "forward propagate" can refer to the movement of signals in direction from an input of a neural network toward an output of the neural network during the forward propagation process. In various examples, forward propagation can be used as a part of a training process for training the neural network to generate desired outputs in response to various inputs.

In some examples, training can involve inputting training data (e.g., training data signals) to the network and allowing the training data to be forward propagated through the network in order to produce corresponding output data signals. The error associated with output data signals can be determined and then back propagated through the network as part of a back propagation process to apportion this error to individual neurons in the network. Thereafter, the weights for each neuron can be adjusted to reduce the total network error for the input data. As used herein the term "back propagate" can refer to the movement of signals in direction from the output of a neural network toward the input of the neural network as part of the back propagation process.

Neural network 216 can include an input layer 217 having input nodes 218-1 to 218-3, but input layer 217 is not so limited. Input nodes 218-1 to 218-3 can respectively receive input data signals x1 to x3 as inputs to neural network 218. For example, input data signals x1 to x3 can be training data signals.

Neural network 216 can include layers 220-1 and 220-2, that can be referred to as hidden layers, between input layer 217 and an output layer 228. Neural network 216 can have various numbers of hidden layers and is not limited to two hidden layers. Layer 220-1 can include neuron models 222-1 to 222-4, but is not limited to four neuron models. Each of the respective neuron models 222-1 to 222-4 can be neuron model 100, for instance.

Each of the respective neuron models 222-1 to 222-4 can be coupled to receive inputs (activation signals) from nodes 218-1 to 218-3. For example, the respective nodes 218-1 to 218-3 can forward propagate the respective input signals x1 to x3 to each of the neuron models 222-1 to 222-4 though an interconnection layer 224-1.

In various examples, nodes 218-1 to 218-3 can propagate the respective input signals x1 to x3 without performing any operations on input signals x1 to x3. Each of the respective interconnections in the interconnection region 224-1 between input layer 217 and layer 220-1 can be a respective synapse. For example, each of the respective synapses coupled between node 218-1 and layer 220-1 can apply a respective weight to input signal x1; each of the respective synapses coupled between node 218-2 and layer 220-1 can apply a respective weight to input signal x2; and each of the respective synapses coupled between node 218-3 and layer 220-1 can apply a respective weight to input signal x3. Each of the respective neuron models 222-1 to 222-4 can generate a respective output data signal, such as an output b as discussed previously in conjunction with FIG. 1, in response to the weighted input signals x1, x2, and x3 and can forward propagate the respective output data signal to layer 220-2 though an interconnection layer 224-2.

Each of the respective interconnections in the interconnection region 224-2 between layer 220-1 and layer 220-2 can be a respective synapse. For example, each of the respective synapses coupled between neuron model 222-1 and layer 220-2 can apply a respective weight to the output signal from neuron model 222-1; each of the respective synapses coupled between neuron model 222-2 and layer 220-2 can apply a respective weight to the output signal from neuron model 222-2; each of the respective synapses coupled between neuron model 222-3 and layer 220-2 can apply a respective weight to the output signal from neuron model 222-3; and each of the respective synapses coupled between neuron model 222-4 and layer 220-2 can apply a respective weight to the output signal from neuron model 222-4.

Layer 220-2 can include neuron models 226-1 to 226-3, but is not limited to three neuron models. Each of the respective neuron models 226-1 to 226-3 can be neuron model 100, for instance. Each of the respective neuron models 226-1 to 226-3 is coupled to each of the neuron models 222-1 to 222-4 by a respective set of synapses in the interconnection region 224-2. For example, each of the respective neuron models 226-1 to 226-3 can receive a respective set weighted signals from a respective set of synapses. Each of the respective neuron models 226-1 to 226-3 can generate a respective output data signal, such as an output b as discussed previously in conjunction with FIG. 1, in response to respective set weighted signals and can forward propagate the respective output data signal to output layer 228 through an interconnection layer 224-3.

Each of the respective interconnections in the interconnection region 224-3 between layer 220-2 and output layer 228 can be a respective synapse. For example, each of the respective synapses coupled between neuron model 226-1 and output layer 228 can apply a respective weight to the output signal from neuron model 226-1; each of the respective synapses coupled between neuron model 226-2 and output layer 228 can apply a respective weight to the output signal from neuron model 226-2; and each of the respective synapses coupled between neuron model 226-3 and output layer 228 can apply a respective weight to the output signal from neuron model 226-3.

Output layer 228 can include neuron models 230-1 and 230-2, but is not limited to two neuron models. Each of the respective neuron models 230-1 and 230-2 can be neuron model 100, for instance. Each of the respective neuron models 230-1 and 230-2 is coupled to each of the neuron models 226-1 to 226-3 by a respective set of synapses in the interconnection region 224-3. For example, each of the respective neuron models 230-1 and 230-2 can receive a respective set of weighted signals from a respective set of synapses. Neuron models 230-1 and 230-2 can respectively generate output signals y1 and y2 in response to the respective set of weighted signals. For example, the respective neuron models 230-1 and 230-2 can respectively generate output data signals y1 and y2 in a manner similar to that described previously for the generation of output b in conjunction with FIG. 1. Note that output data signals y1 and y2 are the outputs of neural network 216.

In various examples, output signals y1 and y2 can be generated as part of training neural network 216, such as in response to input signals x1 to x3 being training signals. In such examples, signals y1 and y2 can be compared to desired outputs to determine error signals. The error signals can be back propagated though neural network 216 from output layer 228 to input layer 217 to determine updates (e.g., corrections) to each of the weights in each of interconnection layers 224-1 to 224-3, and the weights can be subsequently updated with the updates.

Figure 3:
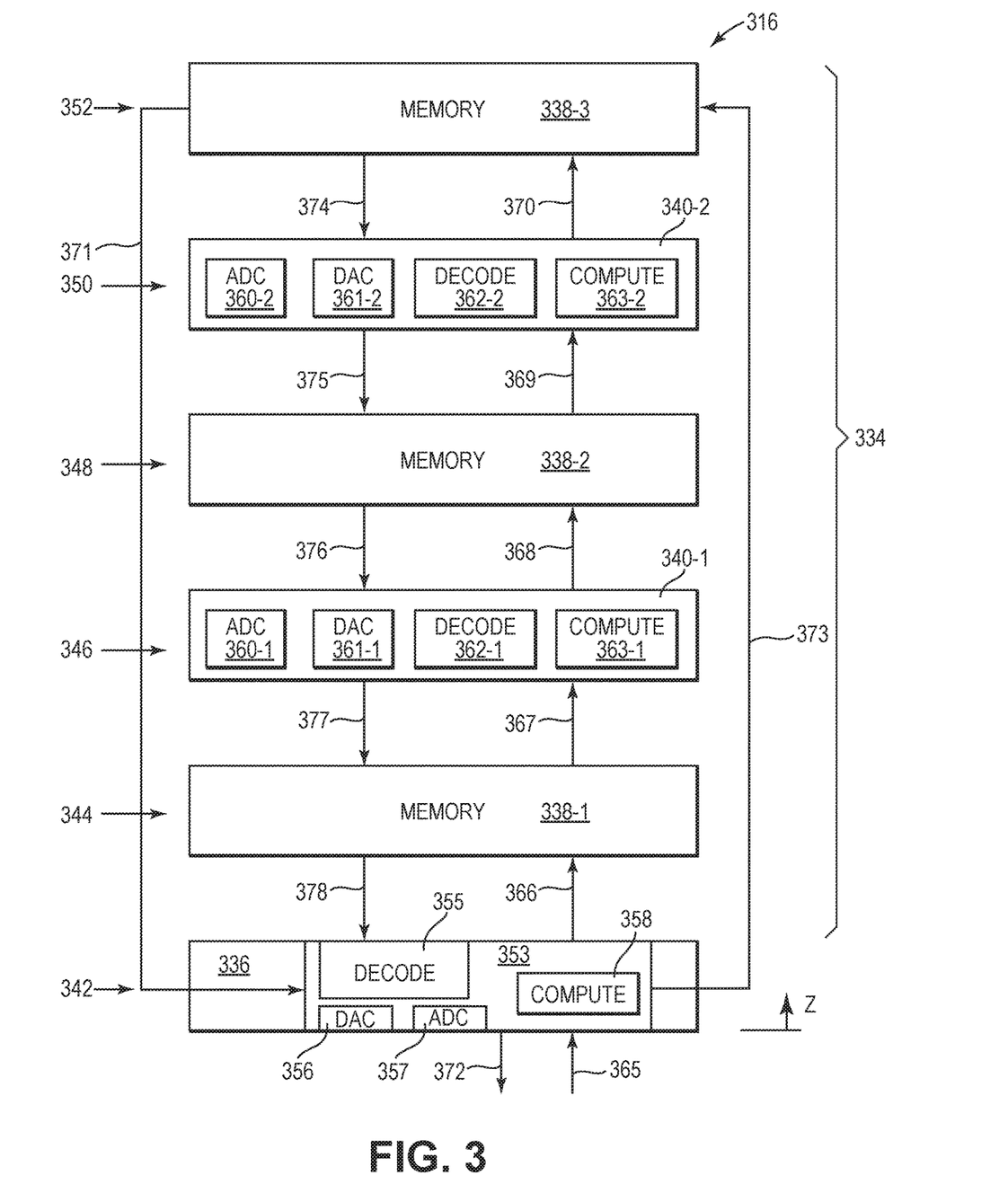
FIG. 3 illustrates a stacked artificial neural network configured to facilitate neural network operations in accordance with a number of embodiments of the present disclosure.

FIG. 3 illustrates a stacked artificial neural network 316 configured to facilitate neural network operations in accordance with a number of embodiments of the present disclosure. For example, neural network 316 can be referred to as a three-dimensional neural network because neural network 316 includes a stack 334 that extends in the z-direction from a planar semiconductor 336. In various examples, artificial neural network 316 can be configured to model artificial neural network 216. In some examples, neural network 316 can operate as a recurrent neural network 316 and/or a bi-directional neural network.

Semiconductor 336 can be a monocrystalline semiconductor, such as monocrystalline silicon, that can be a base structure of neural network 316. For example, semiconductor 336 can be a single semiconductor wafer on which stack 334 is formed. The z-direction is perpendicular to a base plane, such as a base structure (e.g., semiconductor 336), and can be the vertical direction. It should be recognized the term "perpendicular" takes into account variations from "exactly" perpendicular due to routine manufacturing and/or assembly variations and that one of ordinary skill in the art would know what is meant by the term "perpendicular."

Stack 334 can include memories 338-1 to 338-3 that can be referred to as memory layers and that can include arrays of memory cells that can be referred to as memory arrays. Stack 334 can also include circuitries 340-1 and 340-2 that can be referred to as layers of circuitry. For example, circuitries 340-1 and 340-2 can be referred to as logic/analog layers. Neural network 316 can be a single chip having multiple memory layers and multiple layers of circuitry.

Semiconductor 336 can be at a level 342 (e.g., a base level), memory 338-1 at a level 344, circuitry 340-1 at a level 346, memory 338-2 at a level 348, circuitry 340-2 at a level 350, and memory 338-3 at a level 352. As used herein, the term "level" is used to refer to a generally planar region in z-direction that can be the vertical direction. Accordingly, elements formed at a particular level can refer to elements having at least a portion formed within a particular planar region in the z-direction. Different levels can refer to planar regions that do not overlap in the z-direction. Accordingly, elements formed at different levels refer to elements that do not overlap in the z-direction.

In some examples, circuitry 340-1 can be between the pair of memories 338-1 and 338-2, and circuitry 340-2 can be between the pair of memories 338-2 and 338-3 such that each respective layer of circuitry is between a respective pair of the memories. For example, stack 334 can include memories alternating with layers of circuitry, starting with a memory (e.g., memory 338-1) and ending with a memory (e.g., memory 338-3). However, the present disclosure is not so limited. For example, there can be multiple layers of circuitry at different levels between the pair of memories 338-1 and 338-2 and the pair of memories 338-2 and 338-3. Although stack 334 includes three memories 338 and two circuitries 340, there can be various numbers memories 338 and circuitries 340 in stack 334.

Semiconductor 336 can include circuitry 353 that can be formed, for example, using complementary metal-oxide-semiconductor (CMOS) processing. For example, circuitry 353 can include CMOS transistors and other CMOS devices. Circuitry 353 can include decode circuitry 355 that can include a number of decoders. Circuitry 353 can include digital-to-analog conversion (DAC) circuitry 356 and analog-to-digital conversion (ADC) circuitry 357. Semiconductor 336 can include compute circuitry 358 that can perform various mathematical operations and digital computations as described further herein.

DAC circuitry 356 can include a number of digital-to-analog converters (DACs), and ADC circuitry can include a number of analog-to-digital converters (ADCs). DAC can refer to digital-to-analog conversion when used in conjunction with circuitry or a digital-to-analog converter when used alone, and ADC can refer to analog-to-digital conversion when used in conjunction with circuitry or a analog-to-digital converter when used alone.

Each of circuitries 340-1 and 340-2 can include ADC circuitry 360, DAC circuitry 361, decode circuitry 362, and compute circuitry 363 configured to perform digital computations. For example, circuitry 340-1 includes ADC circuitry 360-1, DAC circuitry 361-1, decode circuitry 362-1, and compute circuitry 363-1, and circuitry 340-2 includes ADC circuitry 360-2, DAC circuitry 361-2, decode circuitry 362-2, and compute circuitry 363-2. In various examples, circuitries 340-1 and 340-2 can be formed using thin-film technology and can include thin-film transistors and other thin-film devices. For example, thin-film devices can be polycrystalline (e.g., polycrystalline silicon) based as opposed to CMOS devices being monocrystalline (e.g., monocrystalline silicon) based.

Circuitry 353 can be formed in and/or on semiconductor 336 in what can be sometimes referred to as a front-end-of-the-line process. Stack 334 can be formed, in what can be sometimes referred to as a back-end-of-the-line process, adjacent to (e.g., over) semiconductor 336 after circuitry 353 is formed. For example, memory 338-1 can be formed adjacent to semiconductor 336; circuitry 340-1 can be formed adjacent to memory 338-1; memory 338-2 can be formed adjacent to circuitry 340-1; circuitry 340-2 can be formed adjacent to memory 338-2; and memory 338-3 can be formed adjacent to circuitry 340-2 sequentially.

Front-end-of-the-line processing and the back-end-of-the-line processing can have different thermal constraints with front-end-of-the-line processing involving higher temperatures than back-end-of-the-line processing. For instance, the memories 338 might not be able to withstand the temperatures involved in forming circuitry 353 (e.g., CMOS circuitry) in and/or on a monocrystalline semiconductor, such as semiconductor 336. As such, it might not be feasible to form circuitries 340 in the way circuitry 353 is formed, such as in and/or on monocrystalline semiconductors (e.g., using CMOS processing). However, the memories 338 might be able to withstand the temperatures involved in forming the thin-film devices. As such, thin-film processing can allow circuitry 338-1 to be formed adjacent to memory 338-1 and circuitry 338-2 to be formed adjacent to memory 338-2.

In general, signals can be forward propagated through neural network 316 in the positive z-direction from circuitry 353 toward memory 338-3 and back propagated through neural network 316 in the negative z-direction from memory 338-3 toward circuitry 353. However, the directions of forward and back propagation through neural network 316 can be reversed. Forward propagation and back propagation can be performed while training neural network 316 as previously described in conjunction with FIG. 2.

During forward propagation, digital data signals 365 (e.g., digital data) can be input to neural network 316 by inputting signals 365 into circuitry 353. For example, signals 365 can be digital representations of analog activation signals, such as analog activation voltages. DAC circuitry 355 can convert signals 365 into analog activation signals 366 (e.g., analog voltages) and forward propagate signals 366 to memory 338-1 to activate memory 338-1.

Memory 338-1 can forward propagate analog signals 367 (e.g., currents), based on data stored in memory 338-1, to circuitry 340-1 in response to being activated by signals 366. Circuitry 340-1 can generate data signals (e.g., data values) based on signals 367. Circuitry 340-1 can then forward propagate analog activation signals 368 to memory 338-2 in response to the generated signals to activate memory 338-2.

Memory 338-1 can store weights and can apply those weights to signals 366. Memory 338-1 can sum weighted signals 366 to generate analog signals 367 that can be referred to as weight signals. ADC 360-1 can convert analog signals 367 into digital signals, such as digital representations of signals 367, and compute circuitry 363-1 can compute digital data values (e.g., in the form of digital data signals) by applying functions, such as the function 108, to the digital representations of signals 367. DAC circuitry 361-1 can convert the computed digital data values to analog activation signals 368, and circuitry 340-1 can forward propagate signals 368 to activate memory 338-2.

Memory 338-2 can forward propagate analog signals 369 (e.g., currents), based on data stored in memory 338-2, to circuitry 340-2 in response to being activated by signals 368.

Circuitry 340-2 can generate signals based on signals 369. Circuitry 340-2 can then forward propagate analog activation signals 370 to memory 338-3 in response to the generated signals to activate memory 338-3.

Memory 338-2 can store weights and can apply those weights to signals 368. Memory 338-2 can sum weighted signals 368 to generate analog signals 369 that can be referred to as weight signals. ADC 360-2 can convert analog signals 369 into digital signals, such as digital representations of signals 369, and compute circuitry 363-2 can compute digital data values by applying functions, such as the function 108, to the digital representations of signals 369. DAC circuitry 361-2 can convert the computed digital data values to analog activation signals 370, and circuitry 340-2 can forward propagate signals 370 to memory 338-3 to activate memory 338-3.

Memory 338-3 can forward propagate analog signals 371 (e.g., currents), based on data stored in memory 338-3, to circuitry 353 in response to being activated by signals 370. Circuitry 353 can generate digital data signals (e.g., data values) 372 based on signals 371 and can output digital data signals 372.

Memory 338-3 can store weights and can apply those weights to signals 370. Memory 338-3 can sum weighted signals 370 to generate analog signals 371 that can be referred to as weight signals. ADC 357 can convert analog signals 371 into digital signals, such as digital representations of signals 371, and compute circuitry 358 can compute digital signals 372 by applying functions, such as the function 108, to the digital representations of signals 371.

In some examples, compute circuitry 358 can compare digital data signals 372 to expected digital data signals and can determine digital error signals based on the comparison. DAC circuitry 356 can convert the digital error signals to analog error signals 373 (e.g., an analog voltages). Circuitry 353 can then back propagate error signals 373 to memory 338-3 to activate memory 338-3. Moreover, compute circuitry 358 can determine corrections to the weights stored in memory 338-3 based on digital data signals 372 and the digital error signals.

Memory 338-3 can back propagate analog weight signals 374 (e.g., currents), based on data stored in memory 338-3, to circuitry 340-2 in response to being activated by signals 373. Circuitry 340-2 can generate digital data signals based on analog signals 374. For example, ADC circuitry 360-2 can convert analog signals 374 to digital signals that are digital representations of analog signals 374, and compute circuitry 363-2 can generate the digital data signals by applying a function, such as function 108, to the digital representations of analog signals 374. Circuitry 340-2 can then back propagate analog activation signals 375 to memory 338-2 in response to the generated digital data signals to activate memory 338-2. Moreover, compute circuitry 363-2 can determine corrections to the weights stored in memory 338-2 based on signals 369 and signals 374.

Memory 338-2 can back propagate analog weight signals 376 (e.g., currents), based on data stored in memory 338-2, to circuitry 340-1 in response to being activated by signals 375. Circuitry 340-1 can generate digital data signals based on signals 376. Circuitry 340-1 can then back propagate analog activation signals 377 to memory 338-1 in response to the generated digital data signals to activate memory 338-1. Moreover, compute circuitry 363-1 can determine corrections to the weights stored in memory 338-1 based on signals 367 and signals 376. Memory 338-1 can back propagate analog weight signals 378 (e.g., currents), based on data stored in memory 338-1, to circuitry 353 in response to being activated by signals 377.

Memories 338-1, 338-2, and 338-3 can be reprogrammed with weights that are based on determined weight corrections and the afore-described process can be repeated with data signals 365 to generate another set of weights that can be programmed into memories 338-1 and 338-2. This can be repeated iteratively until digital data signals 372 match the expected digital data signals.

Note that locating circuitries 340-1 and 340-2 in stack 334 respectively between the pair of memories 338-1 and 338-2 and between the pair of memories 338-2 and 338-3 can simplify routing circuitry, reduce the footprint of semiconductor 336, and/or increase the processing speed of neural network 316 compared to the routing, semiconductor footprint, and the processing speed of neural networks that might locate circuitries 340-1 and 340-2 in the semiconductor, as might be done in various previous approaches.

Figure 4:
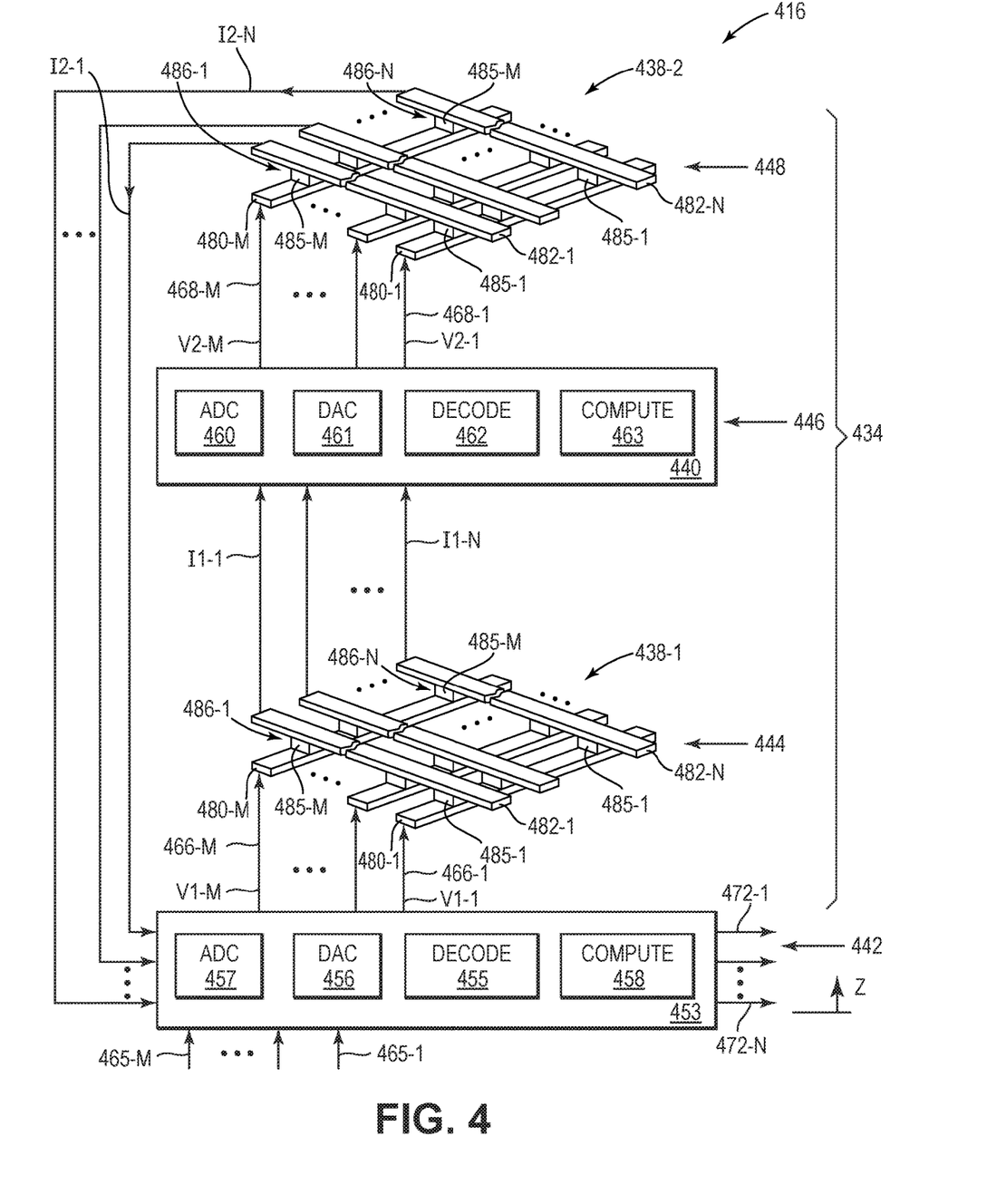
FIG. 4 illustrates a stacked artificial neural network configured to facilitate neural network operations in accordance with a number of embodiments of the present disclosure.

FIG. 4 illustrates a stacked artificial neural network 416 configured to facilitate neural network operations in accordance with a number of embodiments of the present disclosure. Neural network 416 can include circuitry 453 (e.g., CMOS circuitry) that can be formed in and/or on (e.g., integrated in) a semiconductor, such as semiconductor 336, at a level 442 (e.g., a base level). Neural network 416 can include a stack 434 that extends in the z-direction from circuitry 453.

Stack 434 can include a pair of memory arrays 438-1 and 438-2 with circuitry 440 between memory arrays 438-1 and 438-2. Memory arrays 438-1 and 438-2 can respectively be at levels 444 and 448, and circuitry 440 can be at a level 446 that is between levels 444 and 448.

Memory arrays 438 can be referred to as memories, such as memories 338, or can be a portion of a memory 338. Circuitry 440 can be referred to as a layer of circuitry, such as a logic/analog layer. Although stack 434 includes one pair of memory arrays with circuitry therebetween, stack 434 can include various numbers of pairs of memory arrays with a number of circuitries between each pair.

Circuitry 453 can be circuitry 353 and can include DAC circuitry 456 with a number of DACs, ADC circuitry 457 with a number of ADCs, decode circuitry 455 with a number of decoders, and compute circuitry 458. Circuitry 440 can be circuitry 340 and can include DAC circuitry 461 with a number of DACs, ADC circuitry 460 with a number of ADCs, decode circuitry 462 with a number of decoders, and compute circuitry 463 configured to perform digital computations.

Each of memory arrays 438-1 and 438-2 can include signal lines 480-1 to 480-M and signal lines 482-1 to 482-N that cross each other (e.g., intersect in different planes). Signal lines 480-1 to 480-M can be referred to as activation lines, such as access lines (e.g., word lines), and signal lines 482-1 to 482-N can be referred to as data lines (e.g., bit lines). In various examples, signal lines 482-1 to 482-N can be referred to as summing nodes.

Each of memory arrays 438-1 and 438-2 includes memory cells 485 arranged in a cross-point (e.g., crossbar) architecture such that each memory cell 485 is between a signal line 480 and a signal line 482 at each crossing of a signal line 480 and a signal line 482. A respective grouping (e.g., group) of memory cells 485-1 to 485-M can be coupled to each of the respective signal lines 482-1 to 482-N. Each respective grouping of memory cells 485-1 to 485-M can be referred to as a column of memory cells. For example, columns 486-1 to 486-N of memory cells 485-1 to 485-M can be respectively coupled to signal lines 482-1 to 482-N.

A respective grouping of memory cells 485 can be coupled to each of the respective signal lines 480-1 to 480-M. For example, a grouping of memory cells 485-1 to a grouping of memory cells 485-M can be respectively coupled to signal lines 480-1 to 480-M. Each respective grouping of memory cells coupled to a respective signal line 480 can be referred to as a row of memory cells such that each of the columns 486-1 to 486-N includes one memory cell from each row of memory cells. Although arrays 438-1 and 438-2 are shown as single tier arrays (e.g., two-dimensional arrays) with a single tier of memory cells, the disclosure is not so limited, and arrays 438-1 and 438-2 can be multi-tiered arrays (e.g., three-dimensional arrays) having a stack of tiers.

Memory cells 485 can be resistance variable memory cells. The state (e.g., stored data value) of a resistance variable memory cell can depend on the programmed resistance of the memory cell. The programmed resistance can correspond to a threshold voltage (Vt) state of the memory cell such that the cell is placed in a conductive state when an activation voltage applied to (e.g., across) the cell exceeds the Vt of the cell. The cell can conduct current that is proportional to the activation voltage. For example, the current I can be I=Vact×(1/R), with Vact being the activation voltage across the cell and R being the programmed resistance of the cell. In various examples (1/R) can be the weight applied to the activation voltage and the current I can be referred to as a weighted current. Each of the respective memory cells 485 in arrays 438-1 and 438-2 can be programmed to store a respective weight by programming the respective cell to a respective Vt corresponding to a respective resistance. As such, memory cells 485 can function as weighted synapses and can be referred to as weighted synaptic cells.

During operation of the neural network model 416, digital data signals 465-1 to 465-M can be received at circuitry 453 (e.g., from a controller outside of neural network 416). Digital data signals 465-1 to 465-M can be digital representations of analog signals that can be analog voltages. DAC circuitry 456 can convert digital data signals 465-1 to 465-M respectively to analog activation signals 466-1 to 466-M respectively having analog activation voltages V1-1 to V1-M. Decode circuitry 455 can respectively apply voltages V1-1 to V1-M to signal lines 480-1 to 480-M of array 438-1, in response to addresses corresponding to signal lines 480-1 to 480-M, while signal lines 482-1 to 482-N are biased to zero volts, for example, so that the voltage differentials across the memory cells 485-1 to 485-M in each of columns 486-1 to 486-N are respectively V1-1 to V1-M. However, the bias voltage applied to lines 482-1 to 482-N is not limited to zero volts.

Each of the activated memory cells in a column can conduct current from a respective signal line 480 to the signal line 482 coupled to the column so that the currents conducted by the activated memory cells are summed on signal line 482. For example, if memory cells 485-1 to 485-M of the respective columns 486-1 to 486-N respectively coupled to signal lines 482-1 to 482-N are activated, the currents flowing through memory cells 485-1 to 485-M coupled to signal lines 482-1 to 482-N are summed on signal lines 482-1 to 482-N. As such, signal lines 482-1 to 482-N can implement the summing function 104 in FIG. 1.

The sums of the currents on signal lines 482-1 to 482-N can respectively be currents I1-1 to I1-N. Although the present example has taken all of the memory cells 485-1 to 485-M in columns 486-1 to 486-N as being activated, in various instances, fewer than all of the memory cells can be activated and different columns can have different numbers of activated cells.

Note that the current flowing through each activated memory cell can be weighted by the programmed resistance programmed to the respective memory cell and that the sums of the currents on signal lines 482-1 to 482-N are the sums of weighted currents such that currents I1-1 to I1-N can be referred to as weighted sums. Currents I1-1 to I1-N can be forward propagated to circuitry 440 in response to decode circuitry 462 selecting signal lines 482-1 to 482-N in response to addresses corresponding to signal lines 482-1 to 482-N.

ADC circuitry 460 can convert currents I1-1 to I1-N to digital signals, such as digital representations of currents I1-1 to I1-N. Compute circuitry 463 can compute digital data signals from currents I1-1 to I1-N by applying a function, such as function 108, to the digital signals corresponding to currents I1-1 to I1-N.

DAC circuitry 461 can then convert the digital data signals computed by compute circuitry 463 to analog activation signals 468-1 to 468-M that can respectively be analog activation voltages V2-1 to V2-M. Decode circuitry 462 can respectively apply voltages V2-1 to V2-M to signal lines 480-1 to 480-M of array 438-2, in response to addresses corresponding to signal lines 480-1 to 480-M, while signal lines 482-1 to 482-N of array 438-2 are biased to zero volts, for example, so that the voltage differentials across the memory cells 485-1 to 485-M in each of columns 486-1 to 486-N are respectively V2-1 to V2-M.

Currents flowing through memory cells 485-1 to 485-M coupled to signal lines 482-1 to 482-N of array 438-2 and respectively activated in response to voltages V2-1 to V2-M can summed on signal lines 482-1 to 482-N as described previously in conjunction with array 438-1. The summed currents on signal lines 482-1 to 482-N can respectively be weighted currents I2-1 to I2-N. Currents I2-1 to I2-N can be forward propagated to circuitry 453 in response to decode circuitry 455 selecting signal lines 482-1 to 482-N in response to addresses corresponding to signal lines 482-1 to 482-N of array 438-2.

ADC circuitry 457 can convert currents I2-1 to I2-N to digital signals, such as digital representations of currents I2-1 to I2-N. Compute circuitry 458 can compute digital data signals from currents I2-1 to I2-N by applying a function, such as function 108, to each of currents I2-1 to I2-N. For example, digital data signals 472-1 to 472-N can be respectively computed from the digital representations of currents I2-1 to I2-N and output from neural network 416.

Figure 5:
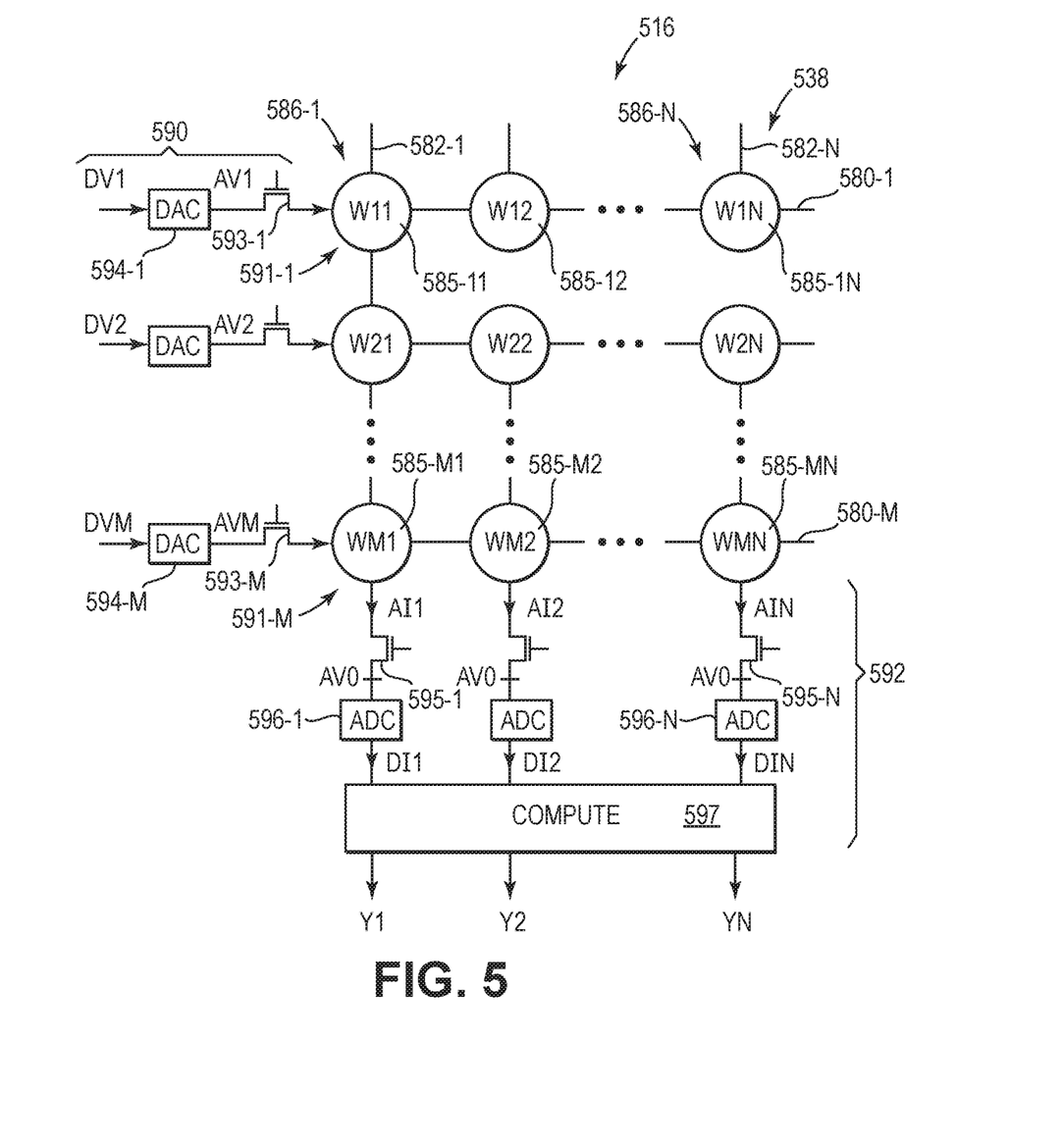
FIG. 5 illustrates a portion of an artificial neural network in accordance with a number of embodiments of the present disclosure.

FIG. 5 illustrates a portion of an artificial neural network 516 that can be neural network 316 or neural network 416 in accordance with a number of embodiments of the present disclosure. Neural network can include circuitry 590 and circuitry 592. A memory array 538 that can be referred to as a memory (e.g., a memory layer) can be between and coupled to circuitry 590 and circuitry 592. Artificial neural network 516 can be a stacked neural network, and circuitry 590, memory array 538, and circuitry 592 can be at different levels in network 516.

In an example, circuitry 590 can be formed in and/or on (e.g., integrated in) a semiconductor, such as semiconductor 336, at a base level, and circuitry 592 can be a layer of circuitry. For example, circuitry 590 can be part of circuitry 453 in FIG. 4 and can be CMOS circuitry, and circuitry 592 can be part of circuitry 440 in FIG. 4 and can be thin-film circuitry. In another example, circuitry 592 can be formed in and/or on a semiconductor, such as semiconductor 336, and circuitry 590 can be a layer of circuitry. For example, circuitry 592 can be part of circuitry 453 and can be CMOS circuitry, and circuitry 590 can be part of circuitry 440 and can be thin-film circuitry. In another example, circuitry 590 and circuitry 592 can respectively be parts of circuitries 340-1 and 340-2 in FIG. 3 and can be thin-film circuitries.

Memory array 538 can be as described for memory arrays 438-1 and 438-2 in FIG. 4. For example, memory array 538 can include signal lines 580-1 to 580-M and signal lines 582-1 to 582-N that cross each other (e.g., intersect in different planes). Signal lines 580-1 to 580-M can be referred to as activation lines, such as access lines (e.g., word lines), and signal lines 582-1 to 582-N can be referred to as data lines (e.g., bit lines). In various examples, signal lines 582-1 to 582-N can be referred to as summing nodes.

Memory array 538 includes memory cells 585 arranged in a cross-point architecture such that each memory cell 585 is between a signal line 580 and a signal line 582 at each crossing of a signal line 580 and a signal line 582. A respective grouping of memory cells can be coupled to each of the respective signal lines 582-1 to 582-N and can be referred to as a column of memory cells. For example, columns 586-1 to 586-N are respectively coupled to signal lines 582-1 to 582-N, and the column 586-1 to the column 586-N respectively include the grouping of memory cells 585-11 to 585-M1 to the grouping of memory cells 585-1N to 585-MN.

A respective grouping of memory cells can be coupled to each of the respective signal lines 580-1 to 580-M and can be referred to as a row of memory cells. For example, rows 591-1 to 591-M are respectively coupled to signal lines 580-1 to 580-M, and the row 591-1 to the row 591-M respectively include the grouping of memory cells 585-11 to 585-1N to the grouping of memory cells 585-M1 to 585-MN. Note that each of the columns 586-1 to 586-N can include one memory cell from each of rows 591-1 to 591-M.

The grouping of memory cells 585-11 to 585-M1 to grouping of memory cells 585-1M to 585-MN can be respectively programmed to store the weights W11 to WM1 to the weights W1N to WMN. For example, a respective weight can correspond to a respective Vt. In various examples, memory cells 585 can be resistance variable memory cells. For example, as described previously, the weight of a resistance variable memory cell can be 1/R, with R being the programmed resistance of the memory cell.

Circuitry 590 can have decode circuitry that can include a decoder, such as a transistor 593, coupled to each of signal lines 580. For example, transistors 593-1 to 593-M can be respectively coupled to signal lines 580-1 to 580-M. In examples in which circuitry 590 can be part of circuitry 453, transistors 593-1 to 593-M can be CMOS transistors and can be part of decode circuitry 455. In examples in which circuitry 590 can be part of circuitry 440 or circuitry 340-1, transistors 593-1 to 593-M can be thin-film transistors (TFTs) and can be part of decode circuitry 462 or 362-1.

Transistors 593-1 to 593-M can be activated in response to receiving respective control signals (e.g., corresponding to respective addresses) at their respective gates. The respective addresses can correspond to the respective addresses of the respective signal lines 580-1 to 580-M and thus the respective rows 591-1 to 591-M. For example, transistors 593-1 to 593-M can be referred to as row decoders.

Circuitry 590 can have DACs 594-1 to 594-M respectively coupled in series with transistors 593-1 to 593-M. In examples in which circuitry 590 can be part of circuitry 453, DACs 594-1 to 594-M can be CMOS DACs and can be part of DAC circuitry 456. In examples in which circuitry 590 can be part of circuitry 440 or circuitry 340-1, DACs 594-1 to 594-M can be thin-film DACs and can be part of DAC circuitry 461 or 361-1.

Circuitry 592 can have decode circuitry that can include a decoder, such as a transistor 595, coupled to each of signals lines 582. For example, transistors 595-1 to 595-N can be respectively coupled to signals lines 582-1 to 582-N. In examples in which circuitry 590 can be part of circuitry 453, transistors 595-1 to 595-N can be CMOS transistors and can be part of decode circuitry 455. In examples in which circuitry 592 can be part of circuitry 440 or circuitry 340-2, transistors 595-1 to 595-N can be TFTs and can be part of decode circuitry 462 or 362-2.

Transistors 595-1 to 595-N can be activated in response to receiving respective control signals (e.g., corresponding to respective addresses) at their respective gates. The respective addresses can correspond to the respective addresses of the respective signal lines 582-1 to 582-N and thus the respective columns 586-1 to 586-N. For example, transistors 595-1 to 595-N can be referred to as column decoders.

Circuitry 592 can have ADCs 596-1 to 596-N respectively coupled in series with transistors 595-1 to 595-N. In various examples, ADCs 596-1 to 596-N can be incorporated into respective sense amplifiers that can sense analog signals, such as currents and/or voltages, on signal lines 582-1 to 582-N. ADCs 596-1 to 596-N can convert the analog signals to digital signals, such as digital representations of the sensed currents and/or voltages.

In examples in which circuitry 590 can be part of circuitry 453, ADCs 596-1 to 596-N can be CMOS ADCs and can be part of ADC circuitry 457. In examples in which circuitry 592 can be part of circuitry 440 or circuitry 340-2, ADCs 596-1 to 596-N can be thin-film ADCs and can be part of ADC circuitry 460 or 360-2.

Circuitry 592 can include compute circuitry 597 coupled to ADCs 596-1 to 596-N. In examples in which circuitry 590 can be part of circuitry 453, compute circuitry 597 can include CMOS circuitry and can be part of compute circuitry 458. In examples in which circuitry 592 can be part of circuitry 440 or circuitry 340-2, compute circuitry 597 can be thin-film compute circuitry and can be part of compute circuitry 463 or 363-2.

During operation of neural network 516, DACs 594-1 to 594-M can respectively receive digital signals (e.g., digital activations) DV1 to DVM that can be digital representations of analog voltages. In examples in which circuitry 590 can be part of circuitry 453, digital signals DV1 to DVM can respectively be digital signals 465-1 to 465-M in FIG. 4. In examples in which circuitry 592 can be part of circuitry 440, digital signals DV1 to DVM can be received from compute circuitry 463. In examples in which circuitry 592 can be part of circuitry 363-2, digital signals DV1 to DVM can be received from compute circuitry 363-2.

DACs 594-1 to 594-M can respectively convert digital signals DV1 to DVM into analog activation signals, such as analog activation voltages AV1 to AVM. Transistors 593-1 to 593-M can respectively transmit activation voltages AV1 to AVM to signal lines 580-1 to 580-M in response to being activated by the respective control signals corresponding to respective row addresses.

In various examples, an analog voltage AV0 that can be zero volts can be applied to signal lines 582-1 to 582-N (e.g., between transistors 595-1 to 595-N and ADCs 596-1 to 596-N), while activation voltages AV1 to AVM are being applied to signal lines 580-1 to 580-M. For example, signal lines 582-1 to 582-N can be coupled to ground while activation voltages AV1 to AVM are being applied to signal lines 580-1 to 580-M. As such, voltage differentials AV1-AV0 to AVM-AV0 can be respectively applied across the memory cells in rows 591-1 to 591-M.

In examples in which circuitry 590 can be part of circuitry 453, activation voltages AV1 to AVM can respectively be the voltages V1-1 to V1-M in FIG. 4. In examples in which circuitry 590 can be part of circuitry 440, activation voltages AV1 to AVM can respectively be the voltages V2-1 to V2-M in FIG. 4.

A memory cell 585 can be activated in response to the voltage differential across the memory cell exceeding the programmed Vt of the cell. A respective current can flow through each activated memory cell 585 from the respective signal line 580 to the respective signal line 582 according to the weight W stored by the cell. For example, as described previously, the current I can be I=Vact×W=Vact×(1/R), with Vact=AV−AV0 being the activation voltage across the cell, W=(1/R) being the programmed weight of the cell, R being the programmed resistance of the cell, AV being an activation voltage applied to the respective signal line 580, and AV0 being a voltage applied to the respective signal line 582. Note that for AV0=0 volts, I=AV×W.

The current flowing through each activated memory cell in each of the respective columns 586-1 to 586-N is summed on the respective signal lines 582-1 to 582-N coupled to the respective columns 586-1 to 586-N. Analog currents AI1 to AIN can respectively be the summed analog currents on signal lines 582-1 to 582-N. For instance, for AV0=0 volts, analog currents AI1 to AIN can respectively be AI1=(AV1× W11+AV2×W21+ . . . AVM×WM1) to AIN=(AV1×W1N+ AV2×W2N+ . . . AVM×WMN).

In examples in which circuitry 592 can be part of circuitry 453, analog currents AI1 to AIN can respectively be the currents I2-1 to I2-N in FIG. 4. In examples in which circuitry 592 can be part of circuitry 440, currents AI1 to AIN can respectively be the currents I1-1 to I1-N in FIG. 4.

Transistors 595-1 to 595-N can respectively transmit analog currents AI1 to AIN to ADCs 596-1 to 596-N in response to being activated by the respective control signals corresponding to respective column addresses. ADCs 596-1 to 596-N can respectively convert analog currents AI1 to AIN to digital signals DI1 to DIN that can respectively be digital representations of analog currents AI1 to AIN. Compute circuitry 597 can apply a respective function, such as the function 108, to the respective digital signals DI1 to DIN to compute respective digital data signals Y1 to YN. In examples in which circuitry 592 can be part of circuitry 453, digital data signals Y1 to YN can respectively be digital data signals 472-1 to 472-N in FIG. 4 that are output from neural network 416.

In examples in which circuitry 592 can be part of circuitry 440, circuitry 440 can generate the analog activation voltages V2-1 to V2-M in FIG. 4 in response to digital data signals Y1 to YN. In various examples, M can be equal to N, and circuitry 440 can respectively convert the digital data signals Y1 to YN to the analog activation voltages V2-1 to V2-M.

The memory cells 485 and 585 can be various types of resistance variable storage elements and/or switch elements. For example, the cells can be phase change random access memory (PCRAM) cells or resistive random access memory (RRAM) cells.

As used herein, a storage element refers to a programmable portion of a memory cell. For instance, memory cells 485 and 585 can include a "stack" structure in which a storage element is coupled in series with a switch element and which can be referred to herein as a 3D phase change material and switch (PCMS) device. 3D PCMS cells can include, for example, a two-terminal chalcogenide-based storage element coupled in series with a two-terminal chalcogenide-based switch element, such as an ovonic threshold switch (OTS). In some examples, the memory cells can be self-selecting memory (SSM) cells in which a single material can serve as both the switch element and the storage element. An SSM cell can include a chalcogenide alloy; however, embodiments are not so limited.

As non-limiting examples, memory cells 485 and 585 can include a phase change material (e.g., phase change chalcogenide alloy) such as an indium (In)-antimony (Sb)-tellurium (Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other memory cell materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

Although the various examples have included memory arrays having memory cells arranged in cross-point architectures, the embodiments are not so limited, and other architectures, such as NAND architectures, can be used. For example, in a NAND architecture, each of number signal lines, such as data lines (e.g., bit lines), can be coupled to a number of strings (e.g., NAND stings) of series-coupled memory cells such that each string stores a respective weight that can govern the current flow through the respective string. For example, the respective weighted current that flows through the respective activated strings can be summed on the bit line coupled to the strings. Each of memory cells in a string can be coupled to a signal line, such as an access line (e.g., a word line), that can carry activation signals for activating the memory cells in the string so that the weighted current can flow through the string.

Figure 6:
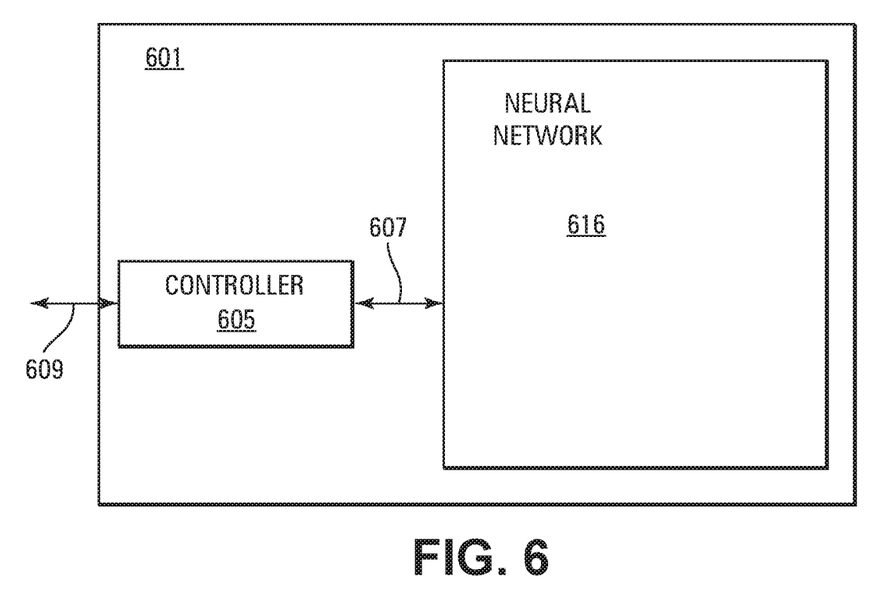
FIG. 6 is a plan view of an apparatus in the form of an artificial neural network system in accordance with a number of embodiments of the present disclosure.

FIG. 6 is a plan view of an apparatus in the form of an artificial neural network system 601, such as a dedicated neural network system, in accordance with a number of embodiments of the present disclosure. For example, neural network system 601 can be formed as a single chip that can include a base semiconductor, such as semiconductor 336 in FIG. 3. In FIG. 6, the bulk of the area of the chip can correspond to a stacked artificial neural network 616 that can be neural network 316, 416, or 516. A relatively small portion of the area of the chip can include a controller 605 that can be coupled to neural network 616 via an interface 607. For example, semiconductor 336 can include controller 605 that can include various CMOS devices.

Controller 605 can control various operations of neural network 616. For example, controller 605 can control various training operations performed by neural network 616 and can control data writes to neural network 616, such as for updating the weights stored by the memory cells during various training runs. Interface 607 can include a data bus and that can support various standards and/or comply with various interface types, such as double data rate (DDR), etc.

Controller 605 can receive commands, such as read and write commands, from a host over a host interface 609. Controller 605 can, for example, generate control signals, corresponding to various addresses, such as row addresses and column addresses, for activating the various row and column decoders of neural network 616. In some examples, controller 605 can receive the addresses from the host via host interface 609. As used herein, neural network 616 might be separately considered an apparatus.

In some examples, neural network 616 can perform the various neural network operations discussed previously on digital data signals, such as digital data signals 365 (FIG. 3) or 465 (FIG. 4), received from controller 605 via interface 607. Neural network 616 can output digital data signals, such as digital data signals 372 or 472, via interface 607, to controller 605 in response to performing the various neural network operations on the digital data signals received from controller 605. In some examples, controller 605 can receive digital data signals from the host via interface 609 and can send the digital data signals to neural network 616 via interface 607 for processing. Controller 605 can receive digital data signals from the neural network 616 via interface 607 and can send the signals to the host via interface 609.

The host can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, the host can include one or more processors capable of accessing neural network 616 (e.g., via controller 605) over interface 609 that can include a bus. Interface 609 can be a standardized interface, such as a serial advanced technology attachment (SATA), peripheral component interconnect express (PCIe), or a universal serial bus (USB), among various others.

Figure 7:
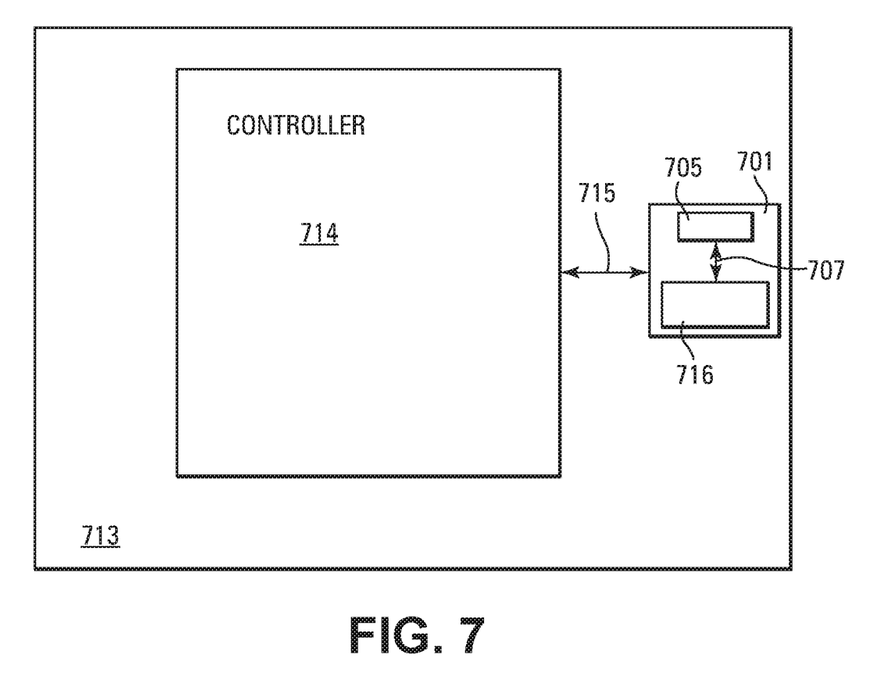
FIG. 7 is a plan view of an apparatus in the form of a system in which a stacked artificial neural network can be implemented in accordance with a number of embodiments of the present disclosure.

FIG. 7 is a plan view of an apparatus in the form of a system 713 in which a stacked artificial neural network can be implemented in accordance with a number of embodiments of the present disclosure. System 713 can be a processor, such as a central processing unit (CPU) or a graphics processing unit (GPU). For example, system 713 can be formed as a single chip that can include a base semiconductor, such as semiconductor 336. In FIG. 7, the bulk of the area of the chip can correspond to a controller 714. A relatively small portion of the area of the chip can include a neural network system 701 that can be system 601. For example, neural network system 701 can include a neural network 716 that can be neural network 616. System 701 can include a controller 705, that can be controller 605, coupled to neural network 716 by an interface 707 that can be interface 607. Controller 714 can be coupled to system 701 by an interface 715.

The semiconductor can include controller 714 that can include various CMOS devices. A portion of the semiconductor can include controller 705, and a portion of the semiconductor can correspond to neural network 716.

In various examples, controller 705 can cause neural network 716 to perform the various neural network operations described previously in response to commands from controller 714. For example, neural network 716 can perform the various neural network operations on digital data signals, such as digital data signals 365 or 465, received from controller 714 via controller 705. Neural network 716 can output digital data signals, such as digital data signals 372 or 472, to controller 714, via controller 705, in response to performing the various neural network operations on the signals received from controller 714.

In the preceding detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising: a base semiconductor at a first level and comprising first circuitry; a first memory at a second level; second circuitry at a third level such that the first memory is between the first circuitry and the second circuitry; and a second memory at a fourth level, wherein the second circuitry is between the second memory and the first memory, wherein the base semiconductor, the first memory, the second memory, and the second circuitry are within a single chip; wherein the first memory and the second memory are part of a stack of memory layers having respective compute circuitry formed there between: wherein the stack of memory layers includes at least a third memory, wherein the memory furthest from the base semiconductor of the stack of memory layers is configured to: back propagate signals to an adjacent memory in the stack: forward propagate signals directly to the first circuitry of the base semiconductor; and receive signals directly from the first circuitry of the base semiconductor: and wherein: the first circuitry is configured propagate a first signal to the first memory; the first memory is configured to propagate a second signal, based on data stored in the first memory, to the second circuitry in response to the first signal; and the second circuitry comprises compute circuitry that is configured to generate a data signal by applying a mathematical function to a digital representation of the second signal.

2. The apparatus of claim 1, wherein the first signal comprises a voltage and the second signal comprises current.

3. The apparatus of claim 1, wherein the second circuitry comprises an analog-to-digital converter that is configured to convert the second signal to the digital representation of the second signal.

4. The apparatus of claim 1, wherein the second circuitry is configured to propagate a third signal to the second memory in response to the data signal.

5. The apparatus of claim 4, wherein:
the data signal is a first data signal;
the second memory is configured to propagate a fourth signal, based on data stored in the second memory, to the first circuitry in response to the third signal; and
the first circuitry is configured to generate a second data signal that is based on the fourth signal.

6. The apparatus of claim 5, wherein the first circuitry is configured to output the second data signal from the apparatus.

7. The apparatus of claim 5, wherein the first circuitry is configured to:
compare the second data signal to a desired data signal;
generate an error signal in response to the compare; and
back propagate the error signal to the second memory.

8. The apparatus of claim 7, wherein:
the second memory is configured to back propagate a fifth signal, based on the data stored in the second memory, to the second circuitry; and
the second circuitry is configured to determine a correction to the data stored in the second memory based on the back propagated the fifth signal.

9. The apparatus of claim 1, wherein
the data signal is a digital data signal; and
the second circuitry comprises a digital-to-analog converter that is configured to convert the digital data signal to an analog signal.

10. The apparatus of claim 1, wherein
the first memory comprises:
a plurality of first groupings of memory cells; and
a plurality of second groupings of memory cells;
each second grouping comprises one memory cell from each first grouping;
the first groupings are coupled to first signal lines;
the second groupings are coupled to second signal lines;
the first signal is one of a plurality of first signals propagated to the memory by applying the first signals to the first signal lines; and
the second signal is one of a plurality of second signals propagated to the second circuitry by the second signal lines.

11. The apparatus of claim 10, wherein
the second circuitry comprises analog- to digital-converters coupled to the second signal lines; and
the analog-to-digital converters are configured to convert the second signals to digital signals.

12. The apparatus of claim 10, wherein
the first circuitry comprises digital-to-analog converters coupled to the first signal lines; and
the digital-to-analog converters are configured to convert digital signals received at the first circuitry to the first signals.

13. The apparatus of claim 1, wherein
the first circuitry comprises CMOS circuitry; and
the second circuitry comprises thin-film circuitry.

14. An apparatus, comprising:
a stacked artificial neural network, comprising:
a base semiconductor substrate comprising first circuitry;
a stack of memory layers formed on the base semiconductor substrate and comprising:
a first memory layer and a second memory layer;
a first layer of compute circuitry formed between the first memory layer and the second memory layer;
a third memory layer located above the second memory layer;
a second layer of compute circuitry formed between the third memory layer and the second memory layer;
wherein the third memory layer is configured to:
back propagate signals to the second memory layer;
forward propagate signals directly to the first circuitry of the base semiconductor; and
receive signals directly from the first circuitry of the base semiconductor;
wherein the first layer of compute circuitry is configured to:
receive signals from one of the first memory layer and the second memory layer;
generate activation signals based on the received signals; and
apply the activation signals to an other of the first memory layer and the second memory layer; and
wherein the base semiconductor substrate, the first memory layer, the second memory layer, the third memory layer, the first layer of compute circuitry, and the second layer of compute circuitry are within a single chip.

15. The apparatus of claim 14, wherein the signals received from the one of the first memory layer and the second memory layer are forward propagated from the one of the first memory layer and the second memory layer, and the activation signals are forward propagated to the other of the first memory layer and the second memory layer.

16. The apparatus of claim 14, wherein the signals received from the one of the first memory layer and the second memory layer comprise error signals and are backward propagated from the one of the first memory layer and the second memory layer, and the activation signals are backward propagated to the other of the first memory layer and the second memory layer.

17. An apparatus, comprising: a base semiconductor at a first level, wherein the base semiconductor comprises first circuitry; a stack extending from the base semiconductor, wherein the stack comprises alternating iterations of memory arrays having circuitry located therebetween, the stack including: a first memory array at a second level; second circuitry at a third level; a second memory array at a fourth level, wherein third level is between the second level and the fourth level; and a memory array furthest from the base semiconductor; wherein the memory array furthest from the base semiconductor is configured to: back propagate signals to a n adjacent memory array in the stack; forward propagate signals directly to the first circuitry of the base semiconductor; and receive signals directly from the first circuitry of the base semiconductor; and wherein: the first circuitry is configured to apply first activation signals to the first memory array; the first memory array is configured to output signals to the second circuitry in response to the applied first activation signals; the second circuitry comprises compute circuitry and is configured to: generate second activation signals based on the signals output to the second circuitry by the first memory array; and apply the second activation signals to the second memory array; and the base semiconductor and the stack extending from the base semiconductor are within a single chip.

18. The apparatus of claim 17, wherein
the first memory array comprises a plurality of groups of memory cells;
each respective group of memory cells is coupled to a respective signal line;
the signals output to the second circuitry by the first memory array comprise a signal on each respective signal line; and
the signal on each respective signal line comprises a sum of respective currents flowing through respective activated memory cells of the respective group of memory cells coupled to the respective signal line.

19. The apparatus of claim 18, wherein each respective current is weighted according to a respective data state of the respective activated memory cell.

20. The apparatus of claim 18, wherein each respective activated memory cell is activated by a respective first activation signal of the applied first activation signals.

21. The apparatus of claim 17, wherein the second circuitry comprises decode circuitry configured to select the signals for output to the second circuitry by the first memory array.

22. A method, comprising: propagating first signals from first circuitry formed in a base semiconductor to a first memory array layer in a stack of layers that extends from the base semiconductor; wherein the stack of layers comprises at least three memory array layers having respective compute circuitry layers formed therebetween; wherein a memory array furthest from the base semiconductor is configured to: back propagate signals to an adjacent memory array layer in the stack; forward propagate signals directly to the first circuitry of the base semiconductor; and receive signals directly from the first circuitry of the base semiconductor; and wherein the method includes: activating the first memory array layer in response to the first signals; propagating second signals, based on data stored in the first memory array layer, from the activated first memory array layer to a first compute circuitry layer of the stack; generating third signals, by the first compute circuitry layer of the stack, in response to the second signals; propagating the third signals to a second memory array layer of the stack, wherein the first compute circuitry layer of the stack is located between the first memory array layer and the second memory array layer, and wherein the base semiconductor and the stack of layers are within a single chip; and activating the second memory array layer in response to the second signals.

23. The method of claim 22, wherein
each propagated second signal comprises a sum of currents respectively flowing through memory cells that are respectively activated by the first signals; and
the currents respectively flowing through the memory cells are respectively weighted according to data states of the memory cells.

24. The method of claim 22, further comprising:
selecting the respective second signals, by respective first decoders of the first compute circuitry before propagating the second signals to the first circuitry; and
selecting the respective third signals, by respective second decoders of the first compute circuitry, before propagating the third signals to the second memory array layer.

25. The method of claim 22, wherein generating third signals, by the first compute circuitry, in response to the second signals, comprises:
converting the second signals to first digital signals by analog-to-digital converters of the first compute circuitry;
generating second digital signals from the first digital signals; and
converting the second digital signals to the third signals by digital-to-analog-converters of the first compute circuitry.

\* \* \* \* \*